US006977383B2

(12) United States Patent
Rieger et al.

(10) Patent No.: US 6,977,383 B2
(45) Date of Patent: Dec. 20, 2005

(54) METHOD AND APPARATUS FOR GENERATING A MEMBRANE TARGET FOR LASER PRODUCED PLASMA

(75) Inventors: Harry R. Rieger, San Diego, CA (US); I. C. Edmond Turcu, Wantage (GB); James Morris, Encinitas, CA (US)

(73) Assignee: JMAR Research, Inc., San Diego, CA (US)

(*) Notice: Subject to any disclaimer, the term of this patent is extended or adjusted under 35 U.S.C. 154(b) by 58 days.

(21) Appl. No.: 10/750,022

(22) Filed: Dec. 31, 2003

(65) Prior Publication Data

US 2004/0200977 A1 Oct. 14, 2004

Related U.S. Application Data

(60) Provisional application No. 60/437,647, filed on Jan. 2, 2003.

(51) Int. Cl.[7] ............................ H05H 6/00; H05H 1/00; G21K 1/00

(52) U.S. Cl. .................... 250/398; 250/505.1; 250/428; 315/111.21; 313/363.1; 356/316

(58) Field of Search ............................. 250/398, 505.1, 250/428; 315/111.21; 313/363.1; 356/316

(56) References Cited

U.S. PATENT DOCUMENTS

2004/0171017 A1 2/2004 Firrao

OTHER PUBLICATIONS

International Search Report of PCT Application No. PCT/US03/41694 issued Nov. 16, 2004.

*Primary Examiner*—Nikita Wells
(74) *Attorney, Agent, or Firm*—Baker & McKenzie LLP

(57) ABSTRACT

A method and apparatus for generating membrane targets for a laser induced plasma is disclosed herein. Membranes are advantageous targets for laser induced plasma because they are very thin and can be readily illuminated by high-power coherent light, such as a laser, and converted into plasma. Membranes are also advantageous because illumination of the membrane with coherent light produces less debris and splashing than illumination of a thicker, solid target. Spherical membranes possess additional advantages in that they can be readily illuminated from variety of directions and because they can be easily placed (i.e. blown) into a target region for illumination by coherent light. Membranes are also advantageous because they can be formed from a liquid or molten phase of the target material. According to another embodiment, membranes can be formed from a solution in which the target materials are solvated. Membranes can be formed an a variety of ways, such as by rotating a circular apparatus through a reservoir of liquid target material such that membranes form across apertures that are disposed in the circular apparatus. Spherical membranes can also be formed by applying a gas (i.e. blowing) against a membrane formed in an aperture of a circular apparatus.

35 Claims, 9 Drawing Sheets

METHOD AND APPARATUS FOR GENERATING A MEMBRANE TARGET FOR LASER PRODUCED PLASMA

This application claims benefit of 60/437,647 filed Jan. 2, 2003.

BACKGROUND

Various methods and systems are known for generating short wavelength radiation. For example, x-rays may be generated by striking a target material with a form of energy such as an electron beam, a proton beam, or a light source such as a laser. Extreme ultraviolet radiation (EUV) may also be generated in a similar manner. Various forms of short-wavelength radiation generating targets are known. These known systems and methods typically irradiate gases, liquids, frozen liquids, or solids to generate the short-wavelength radiation. Current systems that use either room temperature liquid or gas targets impose limitations on the type of chemical elements or materials that can be irradiated because many elements are not in the liquid or gaseous state at ambient pressure and temperature. Hence, the range of desired wavelengths achievable by either gas or liquid systems is also limited.

Solid materials provide a wide range of short-wavelength emissions currently unavailable in materials that are in a liquid or gaseous state at ambient temperature and pressure. One type of prior x-ray generation system uses solid blocks of material (e.g., copper) to generate laser plasma x-rays. In this system, a block of material remains stationary in the irradiation area while laser beam pulses repeatedly irradiate the block of material to produce plasma. The laser beam generates temperatures well over one million degrees Kelvin and pressures well over one million atmospheres on the surface of the material. These extreme temperatures and pressures cause ion ablation and send strong shocks into the solid material. Ion ablation from the surface of the target material at very high speeds and temperatures causes contamination within the radiation chamber as well as to other system equipment such as the radiation collection system and the optics associated with the laser. Thick solid targets induce shock waves that reflect back from the target surface and splash the x-ray chamber with target debris. Ion ablation and target debris decrease the efficiency of the system, increase replacement costs, and shorten the lifetime of the optical and laser equipment.

Another form of solid target material is a very thin tape of target material (e.g., copper (Cu) tape for 1 nm and tin (Sn) tape for 13.5 nm radiation). In these systems, a roll of target tape is dispensed at a predetermined rate while a laser beam pulse irradiates and heats the tape at a desired frequency. The fast ions ablated from the target surface are ejected away from the target. The plasma-generated shock wave breaks through the tape and ejects most of the target material at the back of the target where it can be collected. Thus, use of this tape target reduces ion contamination within the x-ray chamber when compared with solid blocks of target material. Unfortunately, the use of a thin tape target does not completely eliminate target debris at the laser focal point of the target tape. To eliminate or further reduce material contamination within the x-ray chamber, the radiation chamber is typically filled with an inert gas (e.g., helium) at atmospheric pressure. As target ions are ablated from the target material, helium atoms collide with the high-velocity ions, stopping the ions within a few centimeters from the target position. As the helium gas/ion mixture is re-circulated within the radiation chamber, filters trap the ions, recirculating only the helium gas at the completion of the filtration process. The use of thin tape targets and helium gas to stop ablated ions from contaminating the radiation chamber is described in more detail in Turcu, et al., High Power X-ray Point Source For Next Generation Lithography, Proc. SPIE, vol. 3767, pp. 21–32, (1999), incorporated by reference in its entirety into this application. Unfortunately, significant amounts of target debris can still be produced in cooler portions of the laser beam. Moreover, this system does not provide mechanisms that deflect target debris away from optics, and other expensive equipment used in generating radiation.

Current systems and methods utilizing thin tape targets suffer additional disadvantages. The types of materials that are commercially available in thin tape form are extremely limited. Further, thin tape targets require a large tape-dispensing apparatus, which utilizes a significant amount of space within the x-ray chamber, substantially adding to the size and space requirements of such x-ray generators. Tape targets also require frequent reloading of new tape material, which disrupts the operation of the x-ray generator. For example, a reel of thin tape target material having a length of approximately one mile, with a reel diameter of approximately eight inches, typically needs to be replaced with a new reel of tape after a few days of continuous x-ray generation.

The ideal target for a laser-produced plasma should therefore possess the following characteristics. First, the target should be a thin disc with a diameter that matches the focal spot size of the laser beam. The disc should preferably be normal to the laser optical axis. Second, the thickness of the target disc should be minimized to ensure that the laser illuminates all of the target material and therefore formed into plasma. A thin target disc also minimizes ion ablation and shock wave dispersal of the target material. Third, a thin target disc allows more efficient targets to be used. For example, some materials, such as tin or copper, have relatively high conversion efficiencies. Fourth, by utilizing limited amounts of target material in the discs, the amount of debris generated during illumination can be minimized.

In view of this information, a need exists for a method and system that provides short wavelength radiation over a broad range (including x-rays and extreme ultraviolet), with minimum target debris and equipment contamination. There is also a need for short-wavelength radiation-generating targets that approximate a thin disc comprising the target material.

BRIEF SUMMARY

A method and apparatus for generating membrane targets for a laser-induced plasma is disclosed herein. Membranes are advantageous targets for laser induced plasma because they are very thin and can be readily illuminated by high-power coherent light, such as a laser, and converted into plasma. Membranes are also advantageous because illumination of the membrane with coherent light produces less debris and splashing than illumination of a thicker, solid target. Spherical membranes possess additional advantages in that they can be readily illuminated from variety of directions and because they can be easily placed (i.e., blown) into a target region for illumination by coherent light. Membranes are also advantageous because they can be formed from a liquid or molten phase of the target material. According to another embodiment, membranes can be formed from an inert solution in which the target materials are solvated. Membranes can be formed in a variety of ways, such as rotating a circular apparatus through a reservoir of liquid target material such that membranes form across apertures that are disposed in the circular apparatus. Spherical membranes can also be formed by applying a gas (i.e., blowing) against a membrane formed in an aperture of a circular apparatus.

DETAILED DESCRIPTION

A method and apparatus for generating membrane targets for laser-produced plasma are described and depicted below. As stated previously, it is desirable to utilize a target in the shape of a thin disc. Accordingly, a thin membrane comprising the desired substance may be utilized as an approximation of the thin disc, thereby providing a desirable target material. Alternatively, a spherical membrane may be used to approximate a thin disc. Spherical membranes possess the advantage that they may be illuminated with coherent light from more than one direction. These embodiments, as well as the devices used to produce them, are described in further detail below.

Figure 1:
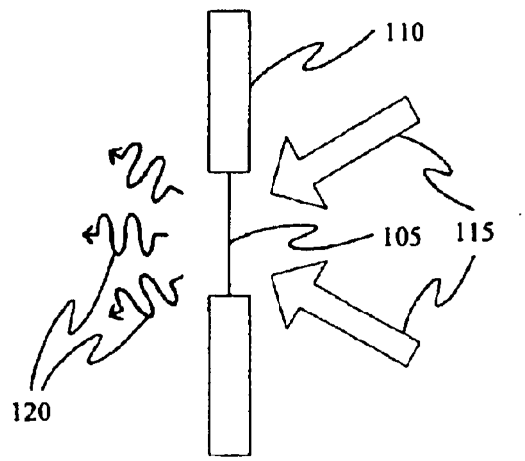
FIG. 1 is a cross-sectional view of an aperture in which a membrane target is formed and converted into plasma by irradiation by high-power coherent light.

A cross-sectional view of one embodiment of a membrane apparatus for laser-produced plasma is depicted in FIG. 1. In FIG. 1, a target membrane 105 is formed in an aperture in a membrane apparatus 110 and is held in place by virtue of the surface tension of the membrane material 105. The membrane is illuminated with coherent light 115, which is preferably focused onto a small spot on the membrane. When illuminated with the coherent light 115, the membrane material 105 forms plasma that generates short wavelength radiation 120. The precise wavelength of the short wavelength radiation 120 depends upon a variety of factors including the intensity, focal spot size, pulse duration, the wavelength and power of the coherent light 115, and the material comprising the target membrane 105. Accordingly, by modifying any of these factors, a wide range of short wavelength radiation may be generated. The short wavelength radiation may run the gamut from extreme ultraviolet (EUV) to X-rays.

The preferred thickness of the target membrane is in the range of about 0.1 μm to about 100 μm, depending on the laser parameters. In addition, the preferred target material for generating EUV comprises tin (Sn) or a solution comprising tin. One embodiment may utilize molten tin with good wetting properties to ensure that the molten tin has sufficient surface tension to form a membrane in the aperture. Other embodiments utilize a solution comprising a mixture of metallic compounds such as tin chloride ($SnCl_2$), zinc chloride (ZnCl), tin oxide ($SnO_2$), lithium (Li), a tin/lead mixture (Sn/Pb), and iodine (I), in a solvent such as water. Utilizing these solutions eliminates the requirement of maintaining the reservoir of target material above the melting point of a target material, such as tin (231° C.). In some applications, such as x-ray microscopy, softer x-rays (~3–5 nm) are required. To provide radiation in this wavelength, carbon-based membrane targets are utilized. Examples of solutions comprising carbon-based microtargets include plastics, oils, and other fluid hydrocarbons.

Figure 2:
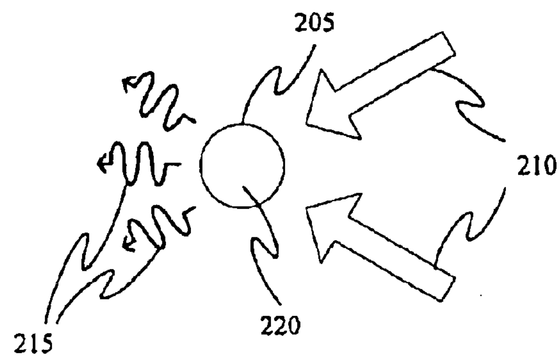
FIG. 2 is a cross-sectional view of a spherical aperture that can be converted into plasma by irradiation with high-power coherent light.

An alternative embodiment of a membrane target is depicted in FIG. 2. In FIG. 2, the target comprises a spherical membrane 205, which is similar to a bubble. The spherical membrane 205 is illuminated with coherent light 210 at sufficient intensity to form plasma. The plasma thereby generates short wavelength radiation 215 at a desired specific wavelength. In a preferred embodiment, the spherical membrane 205 will encase a gas 220 that is preferably of a low atomic number. Although the gas 220 ideally comprises hydrogen, the reactivity of hydrogen gas makes it preferable to select inert gas, such as helium. Gasses with a lower atomic number are preferred because of their lower absorption of short-wavelength radiation 215.

Figure 3:
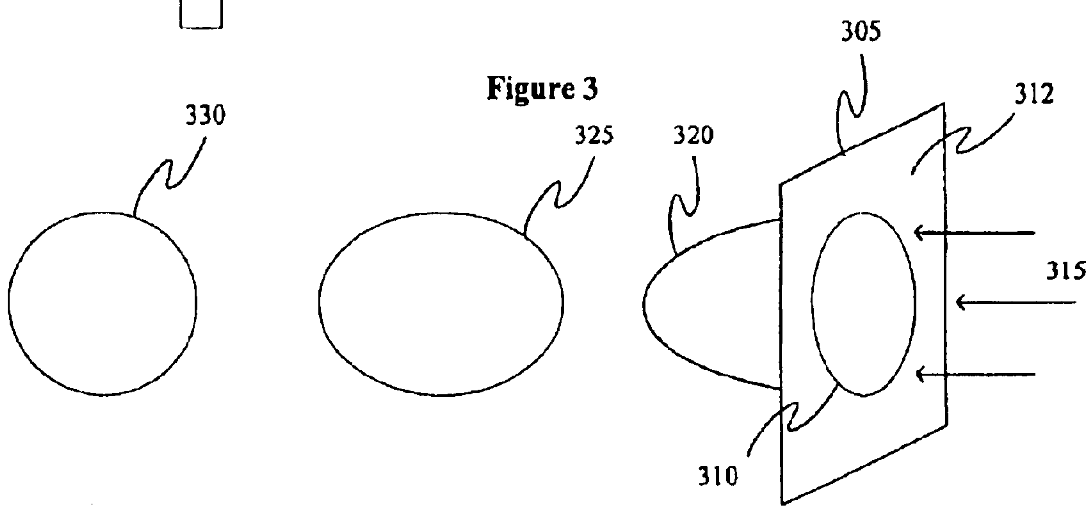
FIG. 3 is an illustration of the process by which a spherical membrane can be formed.

An embodiment for forming a spherical membrane is depicted in FIG. 3. In FIG. 3, a membrane apparatus 305 is provided with an aperture 310 disposed in the apparatus 305. The liquid target material 312 is provided on the surface of the membrane apparatus 305 and forms a membrane across the aperture 310 by virtue of the surface tension of the liquid target material 312. To form the spherical membrane, a gas 315 is applied to the aperture 310 so that the membrane distends from the surface of the membrane apparatus 305. A distending membrane 320 is depicted in FIG. 3. As the gas 315 continues to be applied to the membrane apparatus 305, the force applied by the gas 315 eventually overcomes the surface tension of the distending membrane 320 thereby causing a spherical membrane 325 to form. Initially, the membrane 325 will be aspherical as the perturbations resulting from detachment of the membrane disperse. After a brief period of time, however, the membrane forms a generally spherical shape 330.

Figure 3A:
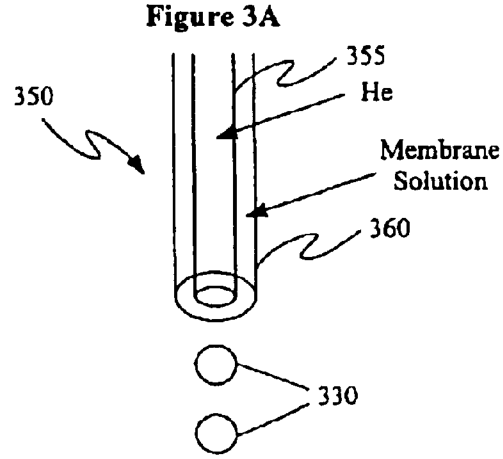
FIG. 3A is an illustration of an alternative apparatus for generating spherical membranes.

An alternative apparatus for forming a spherical membrane is depicted in FIG. 3A. In FIG. 3A, a membrane apparatus 350 is depicted as comprising two concentric tubes 355 and 360. Tube 360 contains a liquid target material such as copper or tin. Tube 355 contains a gas such as helium. The gas and the liquid target material are provided to the end of the membrane apparatus so as to form a spherical membrane 330.

Figure 4:
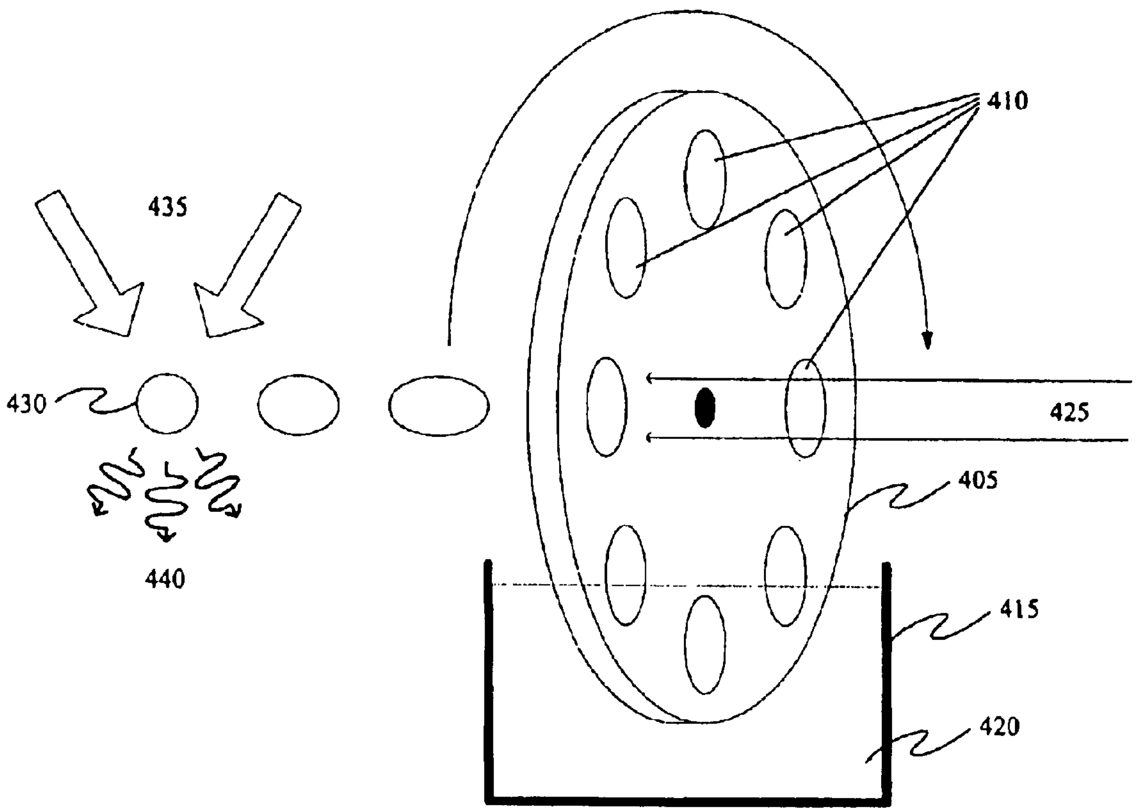
FIG. 4 is an illustration of one embodiment of a circular membrane apparatus that can be utilized to form spherical target membranes.

One embodiment for generating spherical membranes is depicted in FIG. 4. In FIG. 4, a circular membrane apparatus 405 is depicted as comprising a plurality of apertures 410 at the periphery of the apparatus. Also depicted in FIG. 4 is a reservoir 415 that is filled with a liquid solution 420 comprising the target material. The circular membrane apparatus 405 is designed such that it rotates about an axis so that the apertures 410 pass into and out of the reservoir 415. As the apertures 410 pass through the reservoir 415, the target material 420 adheres to the circular membrane apparatus 405, thereby forming a thin membrane over the aperture 410. The preferred composition of the circular membrane apparatus is a material that has good wetting properties with the liquid target material. For example, copper or brass is a preferred material for a circular membrane apparatus 405 that is used with tin (Sn) as a target material.

When the aperture reaches a desired location, a stream of gas 425, such as helium, will be directed to the aperture 410 so that a spherical membrane 430 will be formed. The spherical membrane 430 will then be directed to a target location where it is illuminated with high-intensity coherent light 435. The high-intensity coherent light 435 transforms the spherical membrane 430 into plasma that generates short wavelength radiation 440. Depending upon the particular embodiment, the spherical membrane 430 can be illuminated from a single direction, or from a plurality of directions with multiple beams. Depending upon the number of beams and the illumination pattern on the spherical membrane 430, the short-wavelength radiation generated by the resulting plasma will be generally concentrated in one direction, or may be evenly distributed in all directions ($4\pi$).

Figure 5:
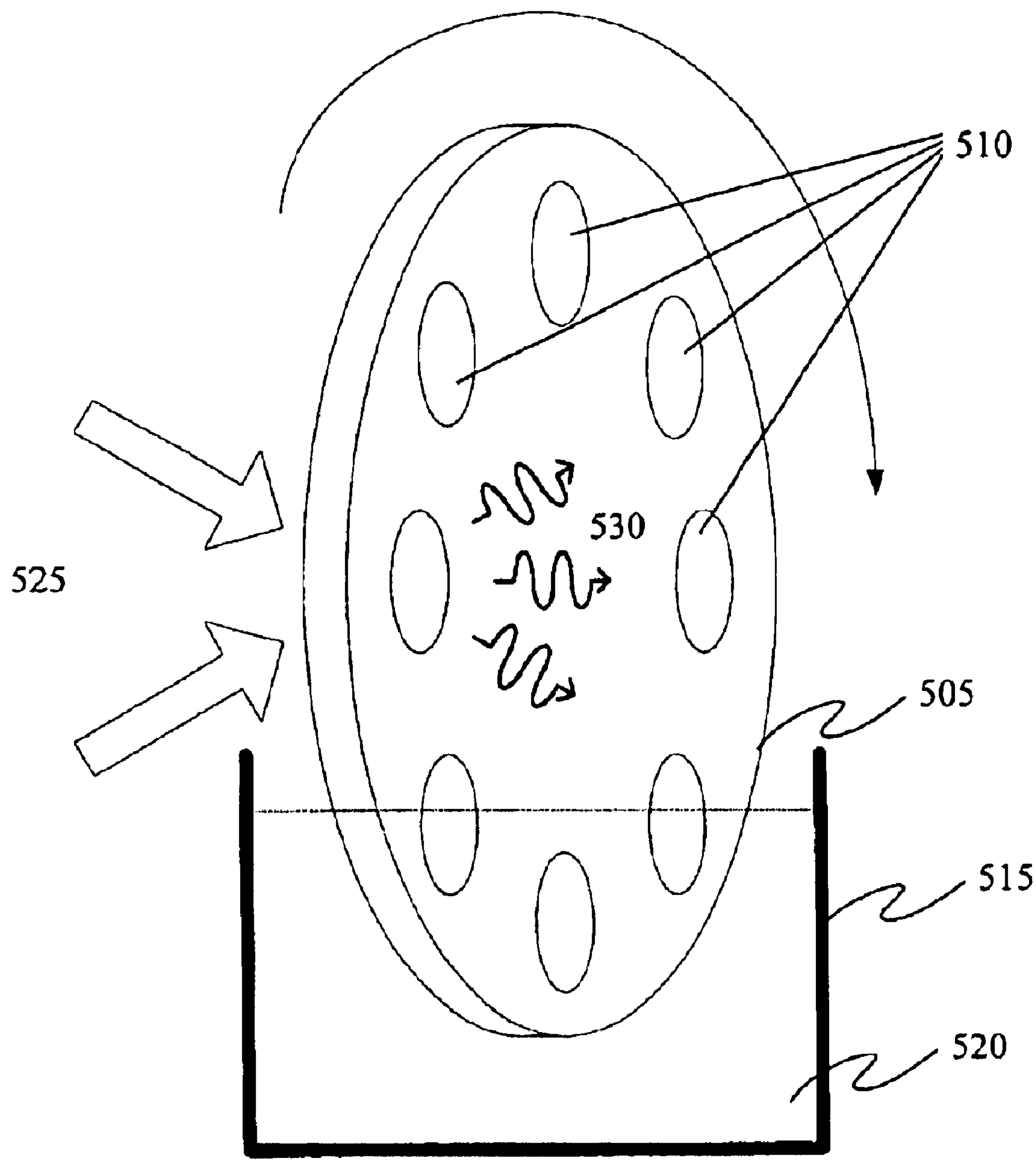
FIG. 5 is an illustration of one embodiment of a circular membrane apparatus that can be utilized to form target membranes, which can be directly illuminated with coherent light to form plasma.

An alternative embodiment for generating short wavelength radiation is depicted in FIG. 5. Much like the embodiment depicted in FIG. 4, the embodiment of FIG. 5 includes a circular membrane apparatus 505, a plurality of apertures 510, a reservoir 515, and a solution of target material 520. The circular membrane apparatus is rotated about its center so that the apertures 510 pass through the reservoir 515 and the solution of target material 520. A membrane of target material will form inside the apertures 510 as they pass out of the solution of target material 520. Unlike the embodiment depicted in FIG. 4, however, the membrane of target material will be directly illuminated with the high-intensity coherent light 525 at sufficient intensity to form plasma, thereby generating short wavelength radiation 530. According to a preferred embodiment, the high-intensity coherent light 525 is focused at the center of the targeted aperture 510. When the membrane is illuminated with the light 525, the membrane will break and the remaining liquid will be collected at the inside edge of the aperture by virtue of the surface tension of the liquid. The apertures may have texture or sintered edges to hold a larger volume of liquid and thereby facilitate formation of a stable membrane. Furthermore, since the laser pulse duration is much shorter than the rotation speed of the circular membrane apparatus 505, synchronization of the laser pulses with the position of the aperture should be relatively straightforward. According to one embodiment, a photodetector and a light source on opposite sides of an aperture can be used to provide a trigger signal for the coherent light source. Another example of a triggering device is disclosed in U.S. patent application Ser. No. 09/907,154, which is hereby incorporated by reference into this application. Other means for synchronizing operation of coherent light source with the position of the circular membrane apparatus 505 will be apparent to one of ordinary skill in the relevant art.

Rotation of the circular membrane apparatuses 405, 505 through their respective reservoirs 420, 520 can cause splashing of the liquid target material 520. Accordingly, appropriate splash guards (not illustrated) should be used to ensure that contamination of the reaction chamber from splashing is minimized. In addition, the rotation speed of the circular membrane apparatus 405, 505 should be limited to ensure that the membrane will not break or distort due to centrifugal force. According to one embodiment, a circular membrane apparatus with a 10 cm radius will have 120×5 mm apertures. This embodiment would be rotated at a speed of 2500 RPM to ensure a 5000 Hz operation.

Figure 5A:
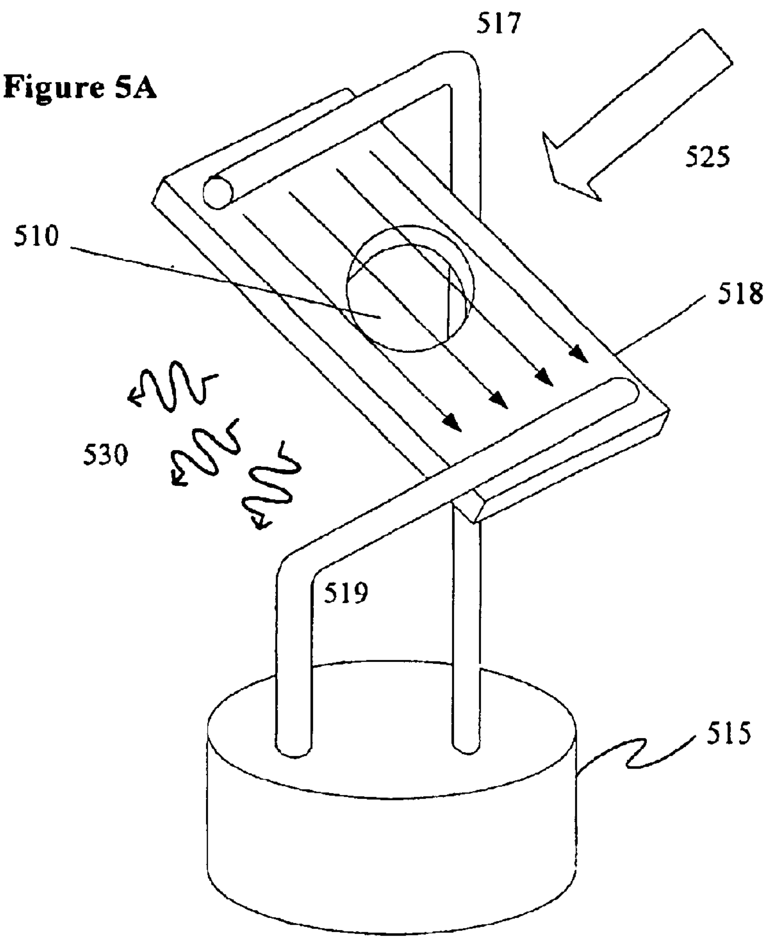
FIG. 5A is an illustration of an alternative embodiment of a membrane apparatus that forms a single target membrane, which can be directly illuminated with coherent light to form plasma.

An alternative embodiment of a membrane-generating apparatus is depicted in FIG. 5A. In FIG. 5A, a reservoir 515 provides target solution to an upper supply line 517 where the solution is poured onto a membrane member 518 so that is cascades over the surface of the membrane member 518 and is collected by the lower supply line 519. As the target solution passes over the surface of the membrane member 518, it forms a membrane in the aperture 510 on the surface of the membrane member 518. More than one aperture 510 can be implemented in the membrane member 518 to provide for multiple targets. The membrane of target material will be directly illuminated with high-intensity coherent light 525 at sufficient intensity to form plasma, thereby generating short wavelength radiation 530. According to a preferred embodiment, the high-intensity coherent light 525 is focused at the center of the targeted aperture 510. When the membrane is illuminated with the light 525, the membrane will break and the remaining liquid will be collected at the inside edge of the aperture by virtue of the surface tension of the liquid. The membrane will then be regenerated by virtue of the solution cascading over the surface of the membrane member 518.

Figure 5B:
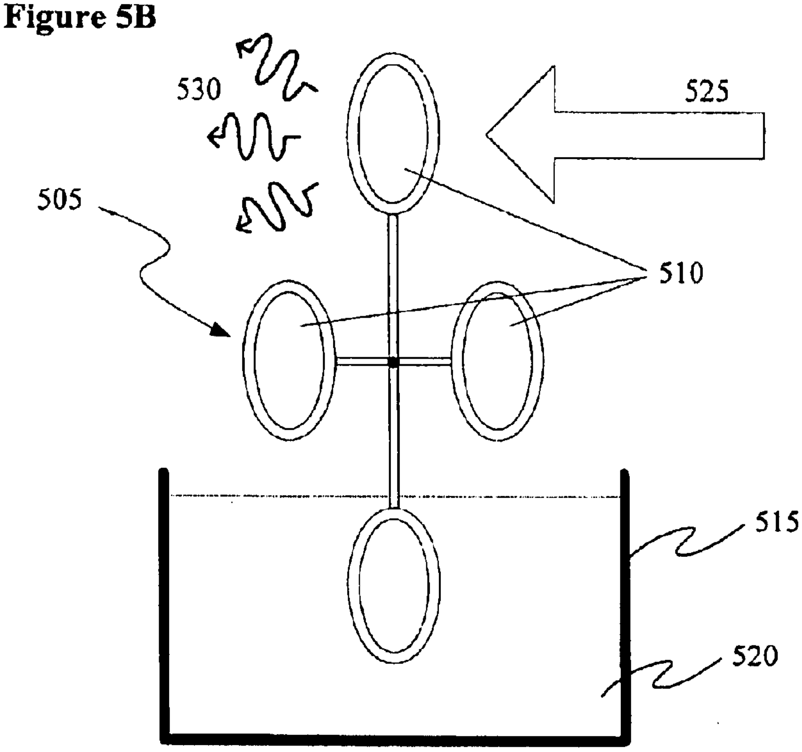
FIG. 5B is an illustration of an alternative embodiment of a membrane apparatus that forms target membranes in circular hoops that can be directly illuminated with coherent light to form plasma.

Yet another embodiment for a membrane-generating apparatus 505 is depicted in FIG. 5B. In FIG. 5B, a series of hoops 510 can be passes through a reservoir 515 containing a target solution 520. The membrane apparatus 505 is rotated about its center so that the hoops 510 pass through the reservoir 515 and the solution of target material 520. A membrane of target material will form inside the hoops 510 as they pass out of the solution of target material 520. The membrane of target material will be directly illuminated with the high-intensity coherent light 525 at sufficient intensity to form plasma, thereby generating short wavelength radiation 530. The hoops can also be used to form spherical membranes in the manner described with reference to FIG. 4. According to a preferred embodiment, the high-intensity coherent light 525 is focused at the center of the hoop 510. When the membrane is illuminated with the light 525, the membrane will break and the remaining liquid will be collected at the inside edge of the hoop by virtue of the surface tension of the liquid. The apertures may have texture or sintered edges to hold a larger volume of liquid and thereby facilitate formation of a stable membrane. Furthermore, since the laser pulse duration is much shorter than the rotation speed of the circular membrane apparatus 505, synchronization of the laser pulses with the position of the aperture should be relatively straightforward. According to one embodiment, a photodetector and a light source on opposite sides of a hoop can be used to provide a trigger signal for the coherent light source. Another example of a triggering device is disclosed in U.S. patent application Ser. No. 09/907,154, which is hereby incorporated by reference into this application. Other means for synchronizing operation of coherent light source with the position of the circular membrane apparatus 505 will be apparent to one of ordinary skill in the relevant art.

Figure 6:
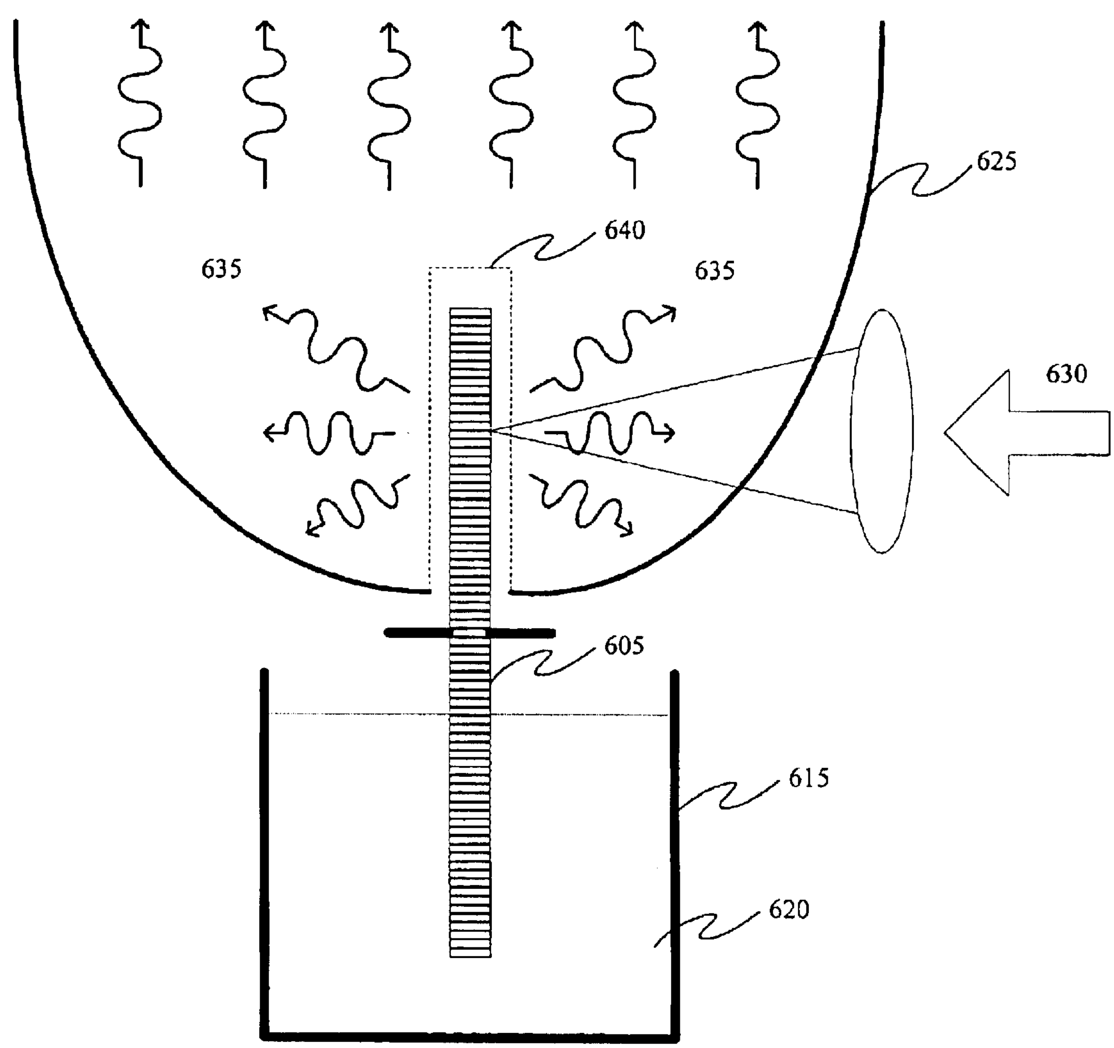
FIG. 6 is a cross-sectional view of one embodiment of a circular membrane apparatus with a parabolic shield for catching short-wavelength radiation generated by a target plasma.

An alternative embodiment that is suitable for use as an EUV light source is depicted in FIG. 6. In FIG. 6, a circular membrane apparatus 605 is shown from a side view such that the plurality of apertures 610 are not visible. Much like the embodiments depicted in FIGS. 4 and 5, the circular membrane apparatus 605 is rotated through a reservoir 615 that contains a liquid target solution or melt 620. As the circular membrane apparatus 605 passes through the reservoir 615, a thin membrane is formed in the plurality of apertures 610. These membranes are passed into the interior of a parabolic reflector 625 so that the target material is disposed generally at the focus point of the parabolic reflector 625. At this point, the membrane will be illuminated by high intensity coherent light 630. As the target material forms plasma, EUV radiation 635 will be emitted and reflected from the surface of the parabolic reflector 625. The EUV radiation reflected by the parabolic reflector 625 will be emitted in a generally collimated manner. By collecting and reflecting this EUV radiation, the parabolic reflector 625 can greatly improve the efficiency of this system as an EUV light source. In a preferred embodiment, the interior of the parabolic reflector 625 will also include a splash shield 640. The splash shield 640 prevents any splashing from the reservoir 615 or the target site from contaminating the interior of the parabolic reflector 625. One example of such a debris control mechanism is described in U.S. Provisional Patent Application No. 60/485,843, entitled "Debris Mitigation Apparatus for Microtarget EUV Source," which is hereby incorporated by reference into this specification. According to another embodiment, an EUV pass filter may be utilized between the target area and the interior of the parabolic reflector 625, whereby the generated EUV radiation will be allowed to pass, but the debris generated by the laser illumination would be confined to the target area. One example of an EUV pass filter is Zirconium (Zr) foil with Mo/Si collector optics (625). Various debris migration techniques may also be utilized such as, for example, electrostatic repellers, magnetic deflection, helium (He) curtains, etc.

Figure 7:
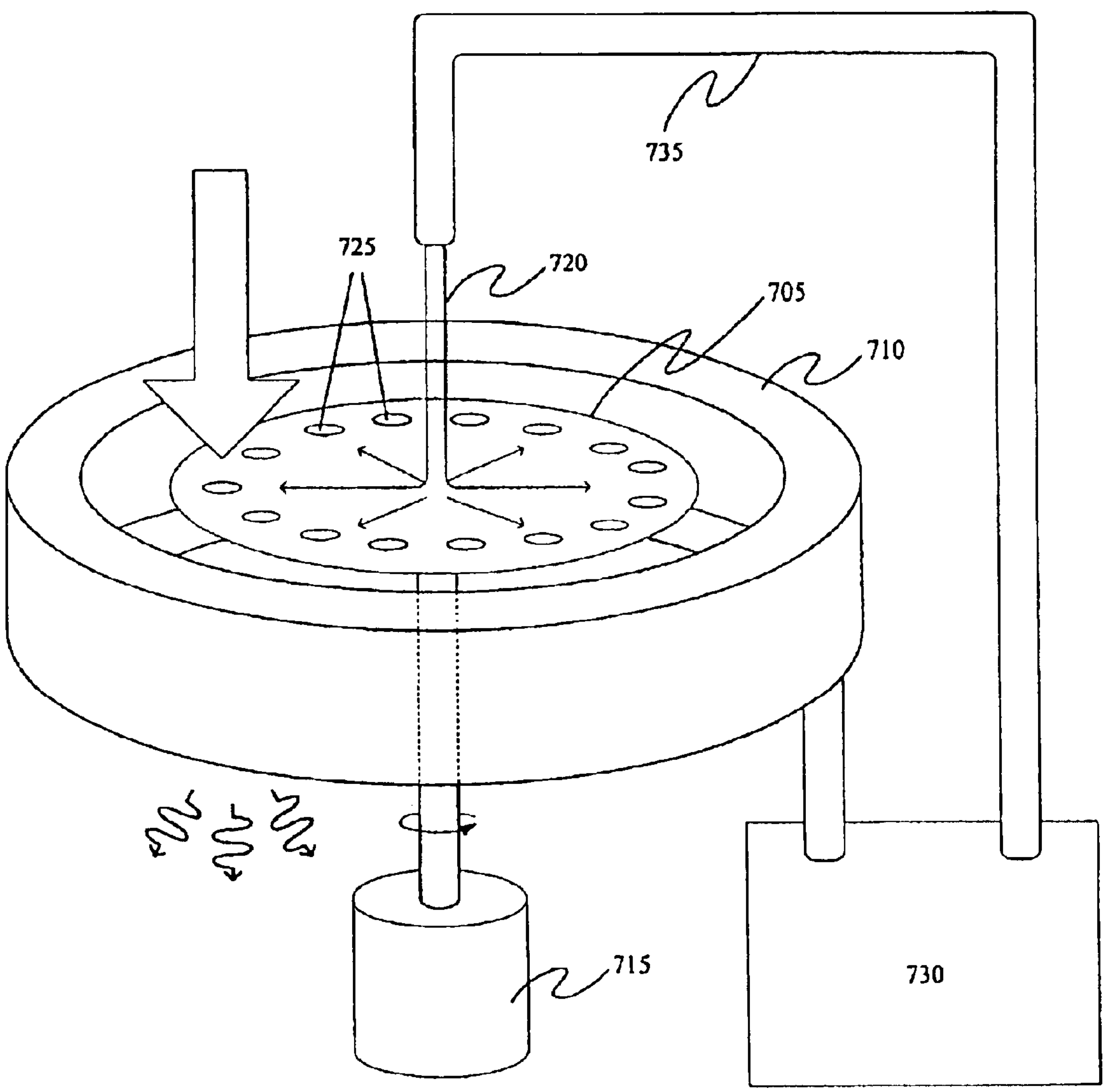
FIG. 7 is a perspective view of an alternative embodiment of a circular membrane apparatus.

Yet another alternative embodiment for generating short-wavelength radiation is depicted in FIG. 7. In FIG. 7, a membrane apparatus 705 is disposed inside of a splash guard 710. The membrane apparatus 705 is designed to be rotated at a specific angular velocity by a motor 715. A liquid target material 720 is applied to the center of the membrane apparatus 705 as it is rotating and is dispersed to apparatus edges by centrifugal force. As the liquid target material 720 is dispersed, it forms a thin membrane on the surface of the membrane apparatus 705. By controlling the angular velocity of the membrane apparatus 705, the thickness of the membrane can be controlled. The thickness of the membrane can also be controlled by other factors such as the kind of the liquid target material, its viscosity, and its relative dissolution. The membrane on the surface of the membrane apparatus 705 can be utilized as a target in several ways. First, the membrane apparatus 705 can comprise one or more apertures 725 disposed at the periphery of the apparatus 705. As these apertures 725 reach a desired location, the membrane formed across the aperture may be utilized as a target for coherent light beams 730. The second way that the membrane can be utilized as a target is to allow the target material to spin off the edge of the membrane apparatus 705, thereby forming a membrane that extends from the outside edge of the membrane apparatus 705. Much like the previously described embodiments, as these membranes are illuminated with high-power coherent light, plasma is formed that can emit short wavelength radiation. According to yet another embodiment, the membrane apparatus has one or more "notches" at its periphery whereby a membrane may be formed within the notch as the apparatus is spun. Other aspects of the embodiment depicted in FIG. 7 include a target material reservoir and pump 740. The reservoir 740 receives the target material captured by the circular splash guard 710 as the membrane apparatus rotates 705. The captured target material may then be recycled and returned to the pipette 735 that supplies the target material to the center of the membrane apparatus 705. In this manner, the target material may be recycled with minimal waste. Furthermore, in the embodiment where the target material is a molten metal such as tin or copper, the reservoir 740 may include a heater that maintains the target material at a desired temperature.

Figure 7A:
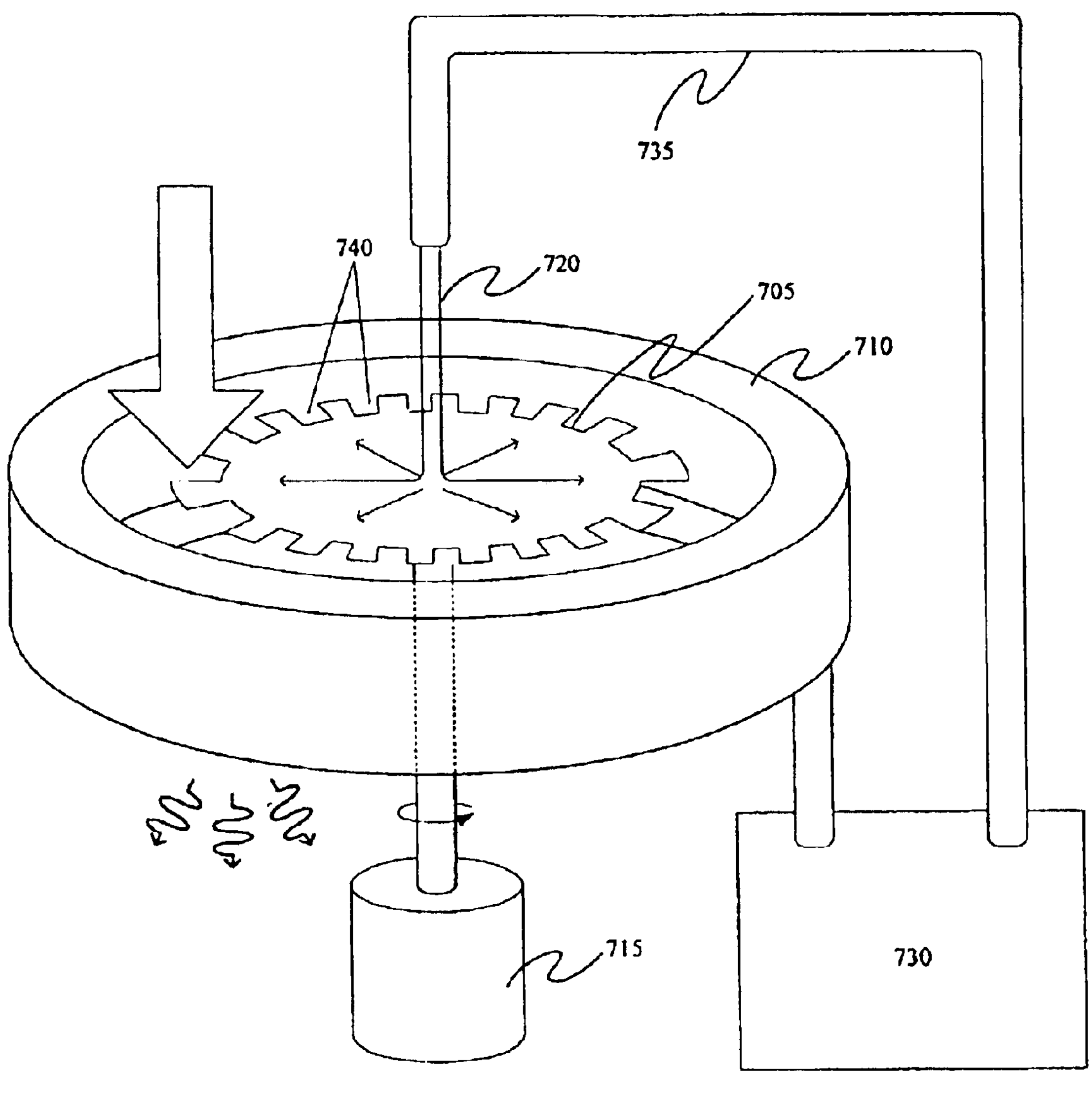
FIG. 7A is a perspective view of an alternative embodiment of a circular membrane apparatus in which notches are used at the periphery of the disc to form membranes.

A further embodiment for generating short-wavelength radiation is depicted in FIG. 7A. In FIG. 7A, a membrane apparatus 705 is disposed inside of a splash guard 710. The membrane apparatus 705 is designed to be rotated at a specific angular velocity by a motor 715. A liquid target material 720 is applied to the center of the membrane apparatus 705 as it is rotating and is dispersed to apparatus edges by centrifugal force. As the liquid target material 720 is dispersed, it forms a thin membrane on the surface of the membrane apparatus 705. By controlling the angular velocity of the membrane apparatus 705, the thickness of the membrane can be controlled. The thickness of the membrane can also be controlled by other factors such as the kind of the liquid target material, its viscosity, and its relative dissolution. As the target solution 720 passes over the outer periphery of the membrane apparatus 705, membranes will be formed within each of the notches 740 that are located at the periphery of the apparatus 705. Much like the previously described embodiments, as these membranes are illuminated with high-power coherent light, plasma is formed that can emit short wavelength radiation. Other aspects of the embodiment depicted in FIG. 7B include a target material reservoir and pump 730. The reservoir 730 receives the target material captured by the circular splash guard 710 as the membrane apparatus rotates 705. The captured target material may then be recycled and returned to the pipette 735 that supplies the target material to the center of the membrane apparatus 705. In this manner, the target material may be recycled with minimal waste. Furthermore, in the embodiment where the target material is a molten metal such as tin or copper, the reservoir 730 may include a heater that maintains the target material at a desired temperature.

Figure 8:
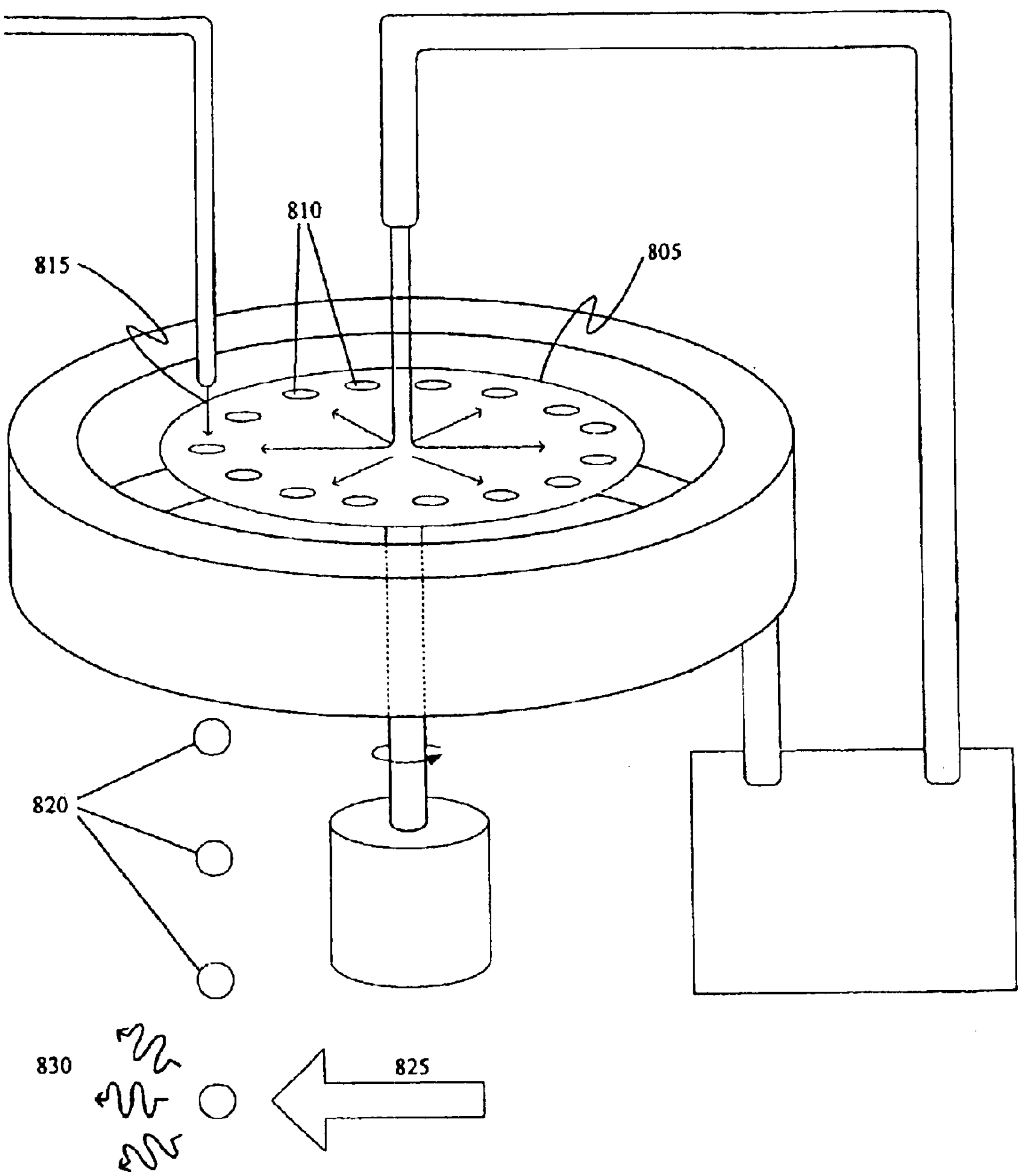
FIG. 8 is a perspective view of yet another embodiment of a circular membrane apparatus.

An alternative embodiment of the centrifugal membrane apparatus of FIG. 7 is depicted in FIG. 8. In FIG. 8, a small pipe or pipette 835 provides a liquid target material to the center of a rotating membrane apparatus 805. Much like the previously described embodiment, the rotating membrane apparatus 805 forms a thin layer of the target material, which can form a membrane across one or more apertures 810 or at the outer edge of the membrane apparatus 805. As these membranes are formed, a stream of gas 815 is provided and thereby forms a continuous supply of spherical membranes 820. These membranes 820 may then be illuminated with high-power coherent light 825 to form plasma that emits desired short-wavelength radiation 830.

Figure 9:
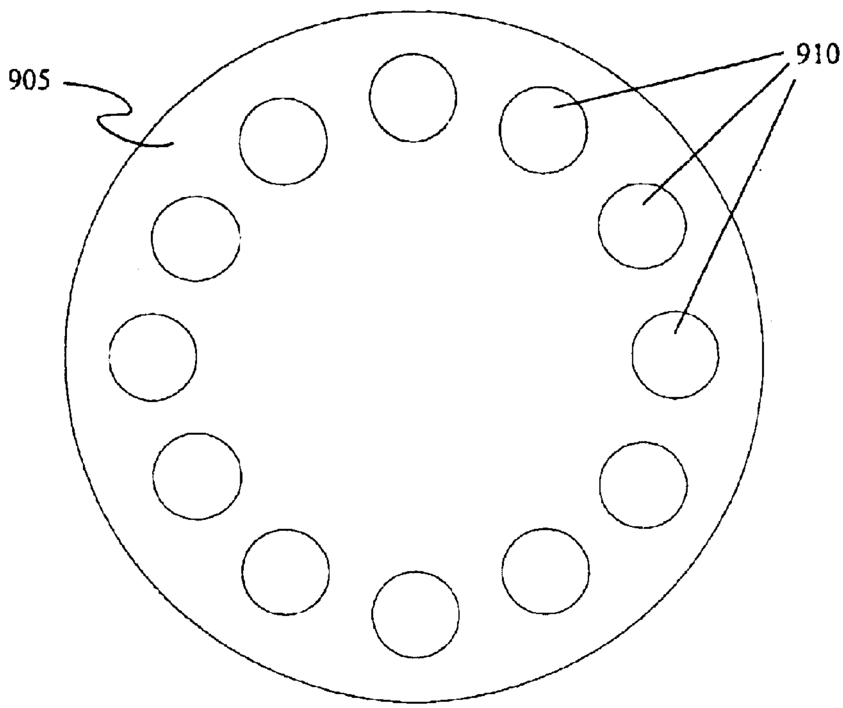
FIGS. 9–9C are illustrations of several alternative apertures that can be implemented into the circular membrane apparatus.
Figure 9A:
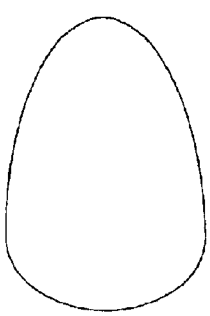
Figure 9B:
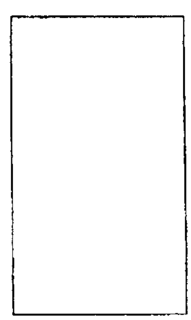
Figure 9C:
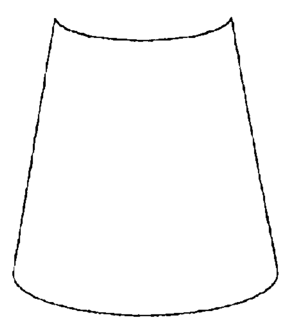

One embodiment of a circular membrane apparatus 905 is depicted in FIG. 9. In FIG. 9, the circular membrane apparatus comprises a plurality of circular apertures 910. Depending upon the needs of the system, the desired thickness of the target membrane, and the properties of the target material, the circular apertures 910 may be replaced with one or more alternative shapes, such as those depicted in FIGS. 9A, 9B and 9C.

Although certain embodiments and aspects of the present inventions have been illustrated in the accompanying drawings and described in the foregoing detailed description, it will be understood that the inventions are not limited to the embodiments disclosed, but are capable of numerous rearrangements, modifications and substitutions without departing from the spirit of the invention as set forth and defined by the following claims and equivalents thereof. Applicant intends that the claims shall not invoke the application of 35 U.S.C § 112, ¶ 6 unless the claim is explicitly written in step-plus-function or means-plus-function format.

What is claimed is:

1. An apparatus for generating a membrane target for laser produced plasma comprising:

a member including at least one aperture, wherein each aperture is operable for providing a liquid membrane target that is supported within the aperture by the surface tension of the liquid; and a targeting apparatus operable to direct short wavelength radiation onto the liquid membrane target so as to generate plasma.

2. An apparatus according to claim 1, wherein the member comprises a disc having the aperture(s) disposed at the periphery of the disc.

3. An apparatus according to claim 2, further comprising:

a motor connected to the disc and operable to rotate the disc;

a reservoir operable for storing liquid target solution wherein the disc is positioned so that the aperture passes through liquid target solution as the disc is rotated and the liquid membrane target is formed at each aperture as it emerges from the reservoir.

4. An apparatus according to claim 2, further comprising a debris containment shield positioned around the disc.

5. An apparatus according to claim 1 wherein each of the apertures is substantially circular.

6. An apparatus according to claim 1 wherein each of the apertures is substantially oval.

7. An apparatus according to claim 1 wherein each of the apertures is substantially arc-shaped.

8. An apparatus according to claim 1 wherein the target material comprises tin (Sn).

9. An apparatus according to claim 1 wherein the target material is a solution comprising a metallic material selected from the group consisting of tin chloride ($SnCl_2$), zinc chloride (ZnCl), tin oxide ($SnO_2$), lithium (Li), lead (Pb), and iodine (I).

10. An apparatus according to claim 9 wherein the solution comprises a mixture of the metallic material with water.

11. An apparatus according to claim 2 wherein a membrane target is formed in each of the aperture(s) by centrifugal motion, the apparatus further comprising:

a motor connected to the disc and operable to rotate the disc; and a target solution dispenser positioned adjacent to the disc such that liquid target solution can be dispensed onto the center of the disc and dispersed about the periphery of the disc when the disc rotates.

12. An apparatus according to claim 11, further comprising:

a target solution reservoir containing liquid target solution, the target solution reservoir connected the target solution dispenser;

a circular splash guard connected to the target solution reservoir and positioned around the periphery of the disc such that excess target solution will be captured by the splash guard when target solution is dispensed onto a rotating disc.

13. An apparatus according to claim 11, further comprising a blower positioned adjacent to the disc and operable to apply pressure to a liquid membrane target so as generate a spherical membrane target on an opposite side of the member.

14. An apparatus for generating a spherical membrane target for laser produced plasma comprising:

a member including at least one aperture, wherein each aperture is operable for providing a liquid membrane target that is supported within the aperture by the surface tension of the liquid;

a blower positioned adjacent to one side of the member, the blower operable for applying pressure to the liquid membrane target so as generate a spherical membrane target on an opposite side of the member; and a targeting apparatus operable to direct short wavelength radiation onto the spherical membrane target so as to generate plasma.

15. An apparatus according to claim 14, wherein the blower blows an inert gas against the membrane target.

16. An apparatus according to claim 14, wherein the member comprises a disc having the aperture(s) disposed at the periphery of the disc.

17. An apparatus according to claim 16, further comprising:

a motor connected to the disc and operable to rotate the disc;

a reservoir operable for storing liquid target solution wherein the disc is positioned so that the aperture passes through liquid target solution as the disc is rotated and the liquid membrane target is formed at each aperture as it emerges from the reservoir.

18. An apparatus according to claim 16, further comprising a debris containment shield positioned around the disc.

19. An apparatus according to claim 14 wherein each of the apertures is substantially circular.

20. An apparatus according to claim 14 wherein each of the apertures is substantially oval.

21. An apparatus according to claim 14 wherein the target material comprises tin (Sn).

22. An apparatus according to claim 14 wherein the target material is a solution comprising a metallic material selected from the group consisting of tin chloride ($SnCl_2$), zinc chloride (ZnCl), tin oxide ($SnO_2$), lithium (Li), lead (Pb), and iodine (I).

23. An apparatus according to claim 22 wherein the solution comprises a mixture of the metallic material with water.

24. An apparatus according to claim 16 wherein a membrane target is formed in each of the aperture(s) by centrifugal motion, the apparatus further comprising:

a motor connected to the disc and operable to rotate the disc; and a target solution dispenser positioned adjacent to the disc such that liquid target solution can be dispensed onto the center of the disc and dispersed about the periphery of the disc when the disc rotates.

25. An apparatus according to claim 24, further comprising:

a target solution reservoir containing liquid target solution, the target solution reservoir connected the target solution dispenser;

a circular splash guard connected to the target solution reservoir and positioned around the periphery of the disc such that excess target solution will be captured by the splash guard when target solution is dispensed onto a rotating disc.

26. An apparatus for generating a spherical membrane target for laser produced plasma comprising:

a first hollow member operable to provide a liquid target solution from a first end;

a second hollow member disposed within the first hollow member wherein the second hollow member is operable to provide a gas from a first end so that a spherical membrane target is formed at the first end; and a targeting apparatus operable to direct short wavelength radiation onto the spherical membrane target so as to generate plasma.

27. An apparatus according to claim 26, further comprising a debris containment shield positioned around the disc.

28. An apparatus according to claim 26 wherein the target material comprises tin (Sn).

29. An apparatus according to claim 26 wherein the target material is a solution comprising a metallic material selected from the group consisting of tin chloride ($SnCl_2$), zinc chloride (ZnCl), tin oxide ($SnO_2$), lithium (Li), lead (Pb), and iodine (I).

30. An apparatus according to claim 29 wherein the solution comprises a mixture of the metallic material with water.

31. A method of providing a spherical membrane target for laser produced plasma comprising:

providing a member including at least one aperture;

applying a liquid target material to the member so as to form a membrane target that is supported within the aperture by the surface tension of the liquid; and applying short wavelength radiation onto the liquid membrane target so as to generate plasma.

32. A method according to claim 31, wherein the member comprises a disc having the aperture(s) disposed at the periphery of the disc, the method further comprising:

rotating the disc through a reservoir containing liquid target solution wherein the disc is positioned so that each of the apertures passes through liquid target solution as the disc is rotated and forms a liquid membrane target as it emerges from the reservoir.

33. A method according to claim 31, further comprising:

applying a stream of gas to the liquid membrane target so as to generate a spherical membrane.

34. A method according to claim 31, wherein the member comprises a disc having the aperture(s) disposed at the periphery of the disc, the method further comprising:

dispensing a target solution onto the center of the disc; and rotating the disc so that the target solution is dispensed about the periphery of the disc where it forms a target membrane within each of the apertures.

35. A method according to claim 34, further comprising:

blowing a gas against a liquid membrane target as generate a spherical membrane target on an opposite side of the member.

* * * * *